United States Patent
Shimomura et al.

(10) Patent No.: US 10,069,478 B2
(45) Date of Patent: Sep. 4, 2018

(54) ACOUSTIC WAVE FILTER, DUPLEXER, AND MODULE

(71) Applicant: TAIYO YUDEN CO., LTD., Tokyo (JP)

(72) Inventors: Hikaru Shimomura, Tokyo (JP); Toshio Nishizawa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 87 days.

(21) Appl. No.: 15/236,109

(22) Filed: Aug. 12, 2016

(65) Prior Publication Data

US 2017/0054431 A1    Feb. 23, 2017

(30) Foreign Application Priority Data

Aug. 18, 2015    (JP) ................... 2015-161411

(51) Int. Cl.
| | | |
|---|---|---|
| *H03H 9/56* | (2006.01) | |
| *H03H 9/58* | (2006.01) | |
| *H03H 9/70* | (2006.01) | |
| *H03H 9/60* | (2006.01) | |

(52) U.S. Cl.
CPC ............ *H03H 9/706* (2013.01); *H03H 9/564* (2013.01); *H03H 9/568* (2013.01); *H03H 9/582* (2013.01); *H03H 9/605* (2013.01)

(58) Field of Classification Search
CPC ........ H03H 9/706; H03H 9/564; H03H 9/568; H03H 9/582; H03H 9/605; H03H 9/02007; H03H 2009/02173; H03H 9/131; H03H 9/132; H03H 9/171

USPC .................. 333/133, 187, 189; 310/312
See application file for complete search history.

(56) References Cited

U.S. PATENT DOCUMENTS

| | | | |
|---|---|---|---|
| 6,657,363 B1 | 12/2003 | Aigner | |
| 7,489,063 B2* | 2/2009 | Isobe ...................... | H03H 3/04 310/312 |
| 2008/0169885 A1* | 7/2008 | Ueda ....................... | H03H 3/04 333/187 |
| 2008/0290969 A1 | 11/2008 | Yamakawa et al. | |
| 2012/0146744 A1* | 6/2012 | Nishihara ............... | H03H 3/02 333/189 |
| 2012/0182092 A1 | 7/2012 | Yokoyama et al. | |

FOREIGN PATENT DOCUMENTS

| | | |
|---|---|---|
| JP | 2011-071913 A | 4/2011 |
| WO | 2007/000929 A1 | 1/2007 |

* cited by examiner

*Primary Examiner* — Barbara Summons
(74) *Attorney, Agent, or Firm* — Chen Yoshimura LLP

(57) ABSTRACT

An acoustic wave filter includes: one or more series resonators connected in series between an input terminal and an output terminal; and parallel resonators connected in parallel between the input terminal and the output terminal and formed of piezoelectric thin film resonators, wherein each of at least two resonators of the parallel resonators includes an additional film having island-shaped patterns or aperture patterns formed at equal pitch intervals in a resonance region in which a lower electrode and an upper electrode face each other across a piezoelectric film, and a pitch interval of the island-shaped patterns or the aperture patterns in the additional film included in one of the at least two resonators differs from a pitch interval of the island-shaped patterns or the aperture patterns in the additional film included in another one of the at least two resonators.

17 Claims, 17 Drawing Sheets

ACOUSTIC WAVE FILTER, DUPLEXER, AND MODULE

CROSS-REFERENCE TO RELATED APPLICATION

This application is based upon and claims the benefit of priority of the prior Japanese Patent Application No. 2015-161411, filed on Aug. 18, 2015, the entire contents of which are incorporated herein by reference.

FIELD

The present invention relates to an acoustic wave filter, a duplexer, and a module.

BACKGROUND

There has been known, as a filter used in a communication device such as a mobile phone, a ladder-type filter in which piezoelectric thin film resonators are connected in a ladder form. The piezoelectric thin film resonator has a structure designed to have a lower electrode and an upper electrode sandwiching a piezoelectric film. A duplexer and a module including a plurality of filters may be installed in a communication device.

In the ladder-type filter, a series resonator and a parallel resonator are configured to have different resonant frequencies. As a technique for forming the frequency difference, it has been known to pattern a frequency control film formed on the upper electrode to make the masses of the frequency control films of the series resonator and the parallel resonator different from each other as disclosed in, for example, International Publication No. 2007/000929. To form the frequency difference and reduce spurious, it has been known to configure the resonators to have an identical pitch interval of and different areas of protrusion patterns or hole patterns formed on the frequency control film as disclosed in, for example, Japanese Patent Application Publication No. 2011-71913.

The conventional technique, however, has room for improvement in reducing spurious.

SUMMARY OF THE INVENTION

According to a first aspect of the present invention, there is provided an acoustic wave filter including: one or more series resonators connected in series between an input terminal and an output terminal; and parallel resonators connected in parallel between the input terminal and the output terminal and formed of piezoelectric thin film resonators, wherein each of at least two resonators of the parallel resonators includes an additional film having island-shaped patterns or aperture patterns formed at equal pitch intervals in a resonance region in which a lower electrode and an upper electrode face each other across a piezoelectric film, and a pitch interval of the island-shaped patterns or the aperture patterns in the additional film included in one of the at least two resonators differs from a pitch interval of the island-shaped patterns or the aperture patterns in the additional film included in another one of the at least two resonators.

According to a second aspect of the present invention, there is provided an acoustic wave filter including: series resonators connected in series between an input terminal and an output terminal and formed of piezoelectric thin film resonators; and one or more parallel resonators connected in parallel between the input terminal and the output terminal, wherein each of at least two resonators of the series resonators includes an additional film having island-shaped patterns or aperture patterns formed at equal pitch intervals in a resonance region in which a lower electrode and an upper electrode face each other across a piezoelectric film, and a pitch interval of the island-shaped patterns or the aperture patterns in the additional film included in one of the at least two resonators differs from a pitch interval of the island-shaped patterns or the aperture patterns in the additional film included in another one of the at least two resonators.

According to a third aspect of the present invention, there is provided a duplexer including: a transmit filter; and a receive filter, wherein at least one of the transmit filter and the receive filter is any one of the above acoustic wave filters.

According to a fourth aspect of the present invention, there is provided a module including any one of the above acoustic wave filters.

DETAILED DESCRIPTION

Hereinafter, embodiments of the present invention will be described with reference to the accompanying drawings.

First Embodiment

Figure 1:
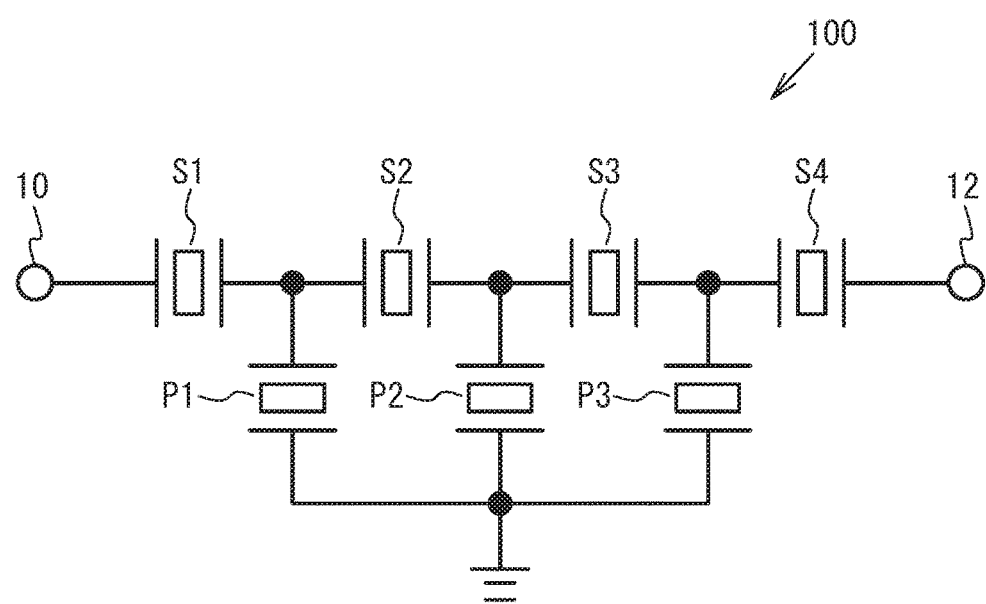
FIG. 1 illustrates an acoustic wave filter in accordance with a first embodiment.

FIG. 1 illustrates an acoustic wave filter 100 in accordance with a first embodiment. As illustrated in FIG. 1, the acoustic wave filter 100 of the first embodiment is a ladder-type filter including one or more series resonators S1 through S4 and one or more parallel resonators P1 through P3. The series resonators S1 through S4 are connected in series between an input terminal 10 and an output terminal 12. The parallel resonators P1 through P3 are connected in parallel between the input terminal 10 and the output terminal 12. That is, the parallel resonator P1 is connected between a node between the series resonators S1 and S2 and a ground. The parallel resonator P2 is connected between a node between the series resonators S2 and S3 and the ground. The parallel resonator P3 is connected between a node between the series resonators S3 and S4 and the ground.

Figure 2A:
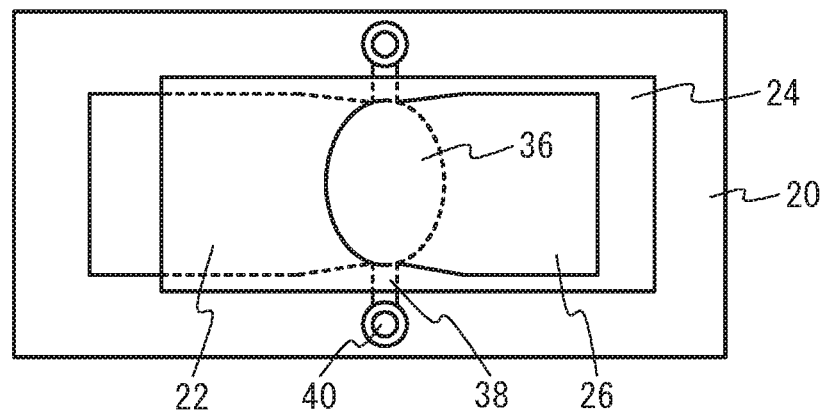
FIG. 2A is a top view of a series resonator and a parallel resonator.
Figure 2B:
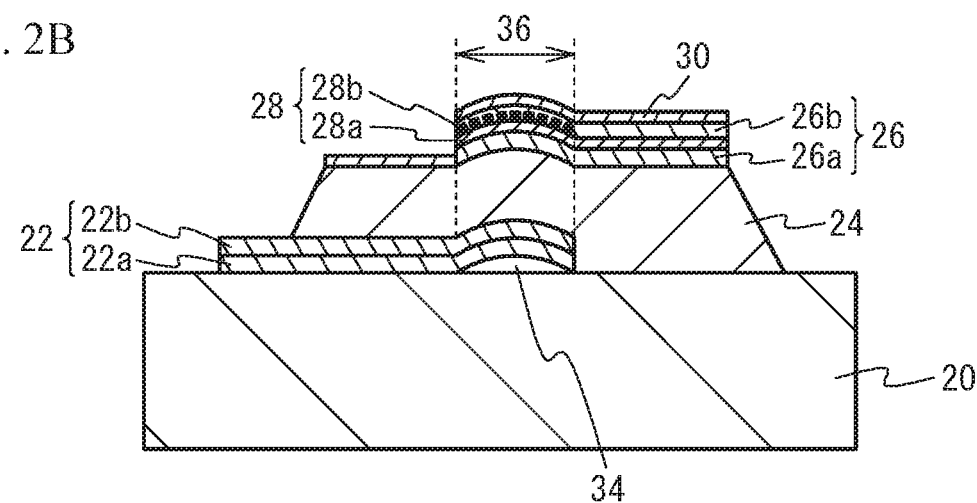
FIG. 2B is a cross-sectional view of the series resonator.
Figure 2C:
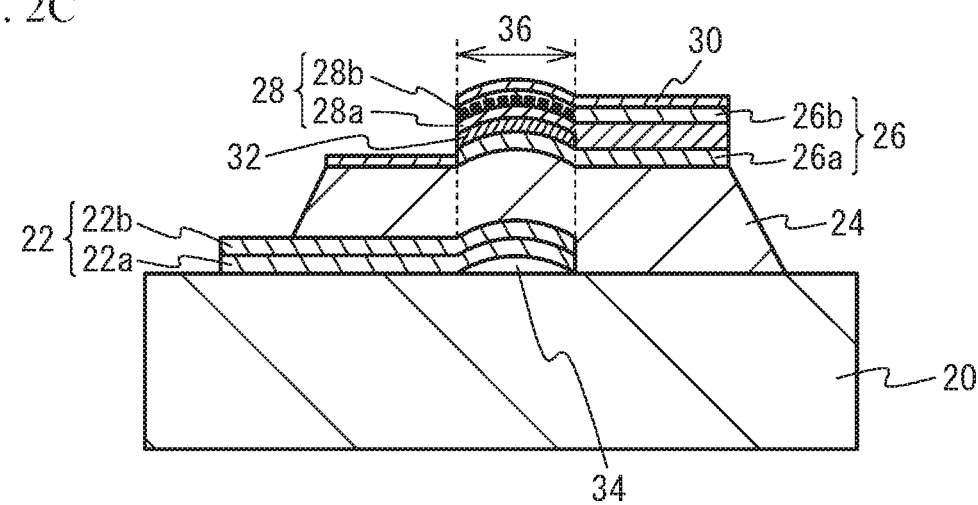
FIG. 2C is a cross-sectional view of the parallel resonator.

FIG. 2A is a top view of the series resonators S1 through S4 and the parallel resonators P1 through P3, FIG. 2B is a cross-sectional view of the series resonators S1 through S4, and FIG. 2C is a cross-sectional view of the parallel resonators P1 through P3. As illustrated in FIG. 2A through FIG. 2C, the series resonators S1 through S4 and the parallel resonators P1 through P3 are piezoelectric thin film resonators each including a lower electrode 22 and an upper electrode 26 that sandwich a piezoelectric film 24 located on a substrate 20.

As illustrated in FIG. 2A and FIG. 2B, each of the series resonators S1 through S4 includes the lower electrode 22 located on the substrate 20 made of, for example, a silicon (S1) substrate. Between the flat upper surface of the substrate 20 and the lower electrode 22, formed is an air gap 34 having a dome-shaped bulge toward the lower electrode 22. The dome-shaped bulge is a bulge having a shape in which the height of the air gap 34 is low in the periphery of the air gap 34 and increases at closer distances to the center of the air gap 34, for example. The lower electrode 22 includes a lower layer 22a and an upper layer 22b. The lower layer 22a is, for example, a chrome (Cr) film, and the upper layer 22b is, for example, a ruthenium (Ru) film.

On the lower electrode 22 and the substrate 20, formed is the piezoelectric film 24 made of, for example, an aluminum nitride (AlN) film having the (002) direction as a main axis. The upper electrode 26 is located on the piezoelectric film 24 so as to have a region (a resonance region 36) in which the upper electrode 26 faces the lower electrode 22 across the piezoelectric film 24. The upper electrode 26 includes a lower layer 26a and an upper layer 26b. The lower layer 26a is, for example, a Ru film, and the upper layer 26b is, for example, a Cr film. The resonance region 36 has, for example, an elliptical shape, and is a region in which an acoustic wave in the thickness extension mode resonates. The resonance region 36 may have a shape, such as a polygonal shape, other than the elliptical shape.

In the resonance region 36, an additional film 28 is located between the lower and upper layers 26a and 26b of the upper electrode 26. The additional film 28 includes a lower layer 28a and an upper layer 28b. The lower layer 28a is, for example, a Ru film, and the upper layer 28b is, for example, a titanium (Ti) film. The additional film 28 has island-shaped patterns formed by patterning the upper layer 28b of the additional film 28. This will be described later.

A silicon oxide film as a first frequency adjusting film 30 is located on the upper layer 26b of the upper electrode 26. The multilayered film in the resonance region 36 includes the lower electrode 22, the piezoelectric film 24, the upper electrode 26, the additional film 28, and the first frequency adjusting film 30. The first frequency adjusting film 30 may function as a passivation film.

An introduction path 38 for etching a sacrifice layer is formed in the lower electrode 22 and the piezoelectric film 24. The sacrifice layer is a layer for forming the air gap 34. The vicinity of the tip of the introduction path 38 is not covered with the lower electrode 22 or the piezoelectric film 24, and includes a hole portion 40 formed therein.

As illustrated in FIG. 2A and FIG. 2C, compared with the series resonators S1 through S4, each of the parallel resonators P1 through P3 includes a second frequency adjusting film 32 located between the lower layer 26a of the upper electrode 26 and the lower layer 28a of the additional film 28 and in the resonance region 36. The second frequency adjusting film 32 is, for example, a Ti film. Accordingly, the multilayered film in the resonance region 36 includes, in addition to the multilayered film of the series resonators S1 through S4, the second frequency adjusting film 32 formed across the entire surface of the resonance region 36. Other configuration are the same as those of the series resonators S1 through S4, and thus the description thereof is omitted.

The difference in resonant frequency between the series resonators S1 through S4 and the parallel resonators P1 through P3 can be adjusted with the film thickness of the second frequency adjusting film 32. The series resonators S1 through S4 have, for example, an identical resonant frequency, and the parallel resonators P1 through P3 have, for example, an identical resonant frequency. The resonant frequencies of the series resonators S1 through S4 and the parallel resonators P1 through P3 can be adjusted with the film thickness of the first frequency adjusting film 30. The second frequency adjusting film 32 may not be necessarily located between the lower layer 26a of the upper electrode 26 and the lower layer 28a of the additional film 28, and is only required to be located in the multilayered film in the resonance region 36. No second frequency adjusting film 32 may be located. At least one layer of the lower electrode 22, the piezoelectric film 24, and the upper electrode 26 of the series resonators S1 through S4 may be configured to have a different film thickness from that of the parallel resonators P1 through P3.

The substrate 20 may be, for example, a quartz substrate, a glass substrate, a ceramic substrate, or a gallium arsenide (GaAs) substrate instead of a S1 substrate. The lower electrode 22 and the upper electrode 26 may be formed of a single layer metal film of, for example, aluminum (Al), titanium (Ti), copper (Cu), molybdenum (Mo), tungsten (W), tantalum (Ta), platinum (Pt), rhodium (Rh), or iridium (Ir), or a multilayered film of at least two of them instead of Cr and Ru.

The piezoelectric film 24 may be, for example, a zinc oxide (ZnO) film, a lead zirconate titanate (PZT) film, or a lead titanate (PbTiO$_3$) film instead of an aluminum nitride film. Alternatively, the piezoelectric film 24 may be mainly composed of aluminum nitride, and contain other elements to improve the resonance characteristic or the piezoelectricity. For example, the use of scandium (Sc) as an additive element improves the piezoelectricity of the piezoelectric film 24, improving the effective electromechanical coupling coefficient of the piezoelectric thin film resonator.

The additional film 28 may be made of a single layer metal film of, for example, Cr, Al, Cu, Mo, W, Ta, Pt, Rh, or Ir, or a multilayered film of at least two of them instead of Ru and Ti. The additional film 28 may be an insulating film such as metal nitride or metal oxide, but is preferably made of a metal to reduce the resistance of the upper electrode 26.

The first frequency adjusting film 30 may be, for example, a silicon nitride film or an aluminum nitride film instead of a silicon oxide film. The second frequency adjusting film 32 may be made of a single layer metal film of, for example, Ru, Cr, Al, Cu, Mo, W, Ta, Pt, Rh, or Ir, or a multilayered film of at least two of them instead of Ti. The second frequency adjusting film 32 may be made of an insulating film such as metal nitride or metal oxide, but is preferably made of a metal to reduce the resistance of the upper electrode 26.

Figure 3A:
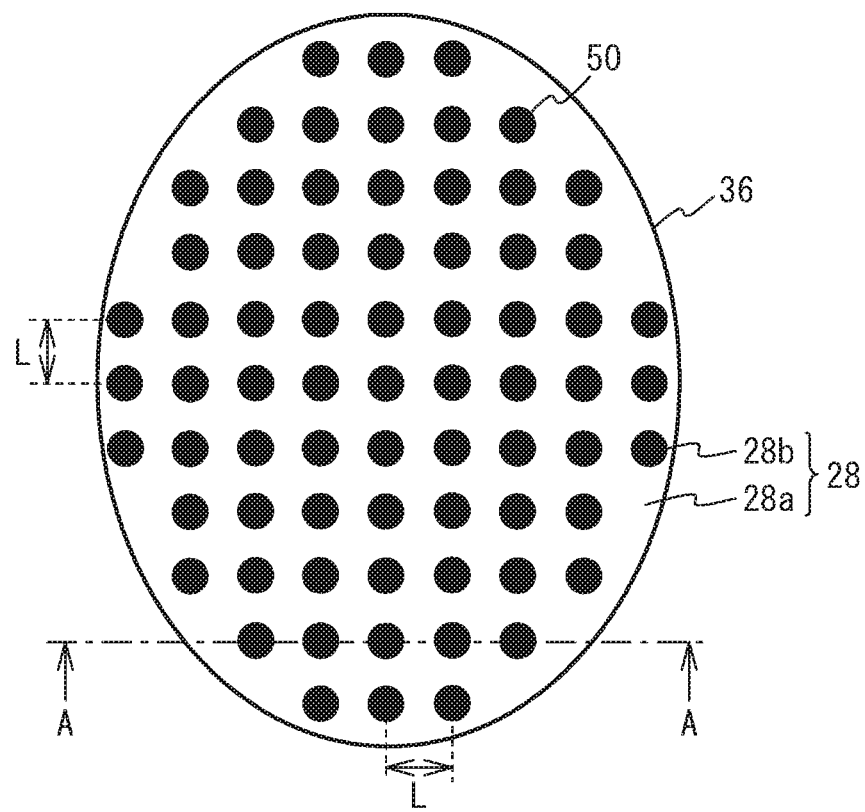
FIG. 3A is a top view of an exemplary additional film.
Figure 3B:
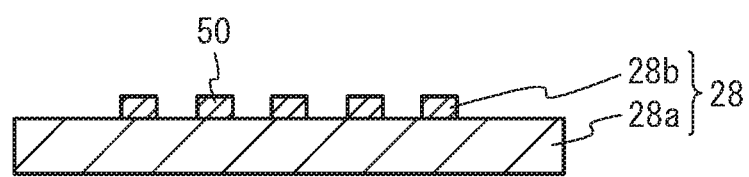
FIG. 3B is a cross-sectional view taken along line A-A in FIG. 3A.
Figure 4:
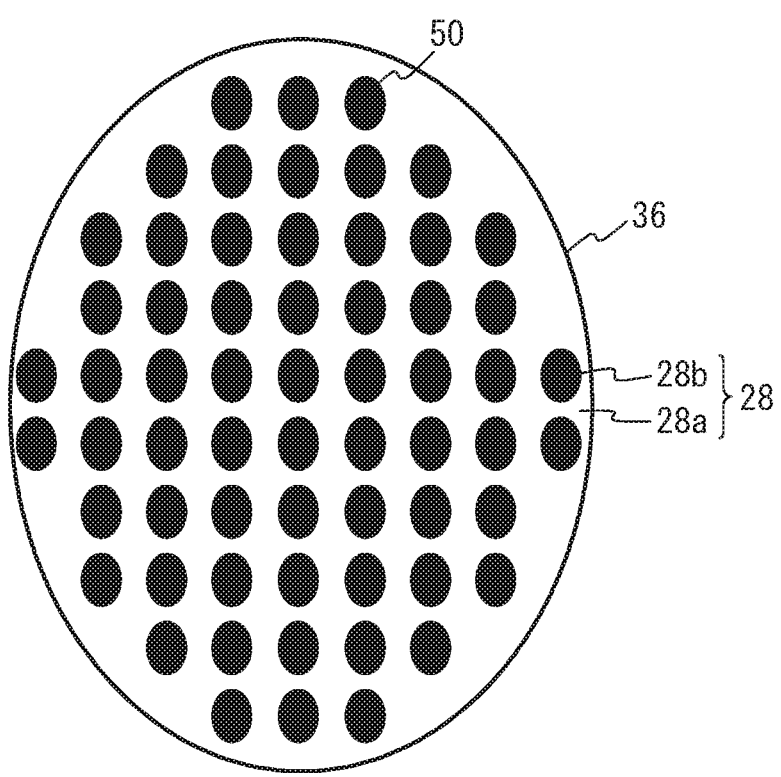
FIG. 4 is a top view of the additional film in which each of the island-shaped patterns has an elliptical shape as viewed from above.

FIG. 3A is a top view of an example of the additional film 28, and FIG. 3B is a cross-sectional view taken along line A-A in FIG. 3A. As illustrated in FIG. 3A and FIG. 3B, the additional film 28 located in the resonance region 36 has island-shaped patterns 50. For example, the additional film 28 has a structure in which the upper layer 28b patterned into the island-shaped patterns 50 is formed on the flat upper surface of the lower layer 28a. The island-shaped patterns 50 are formed to have an identical dimension as viewed from above and to be arranged at equal intervals of a pitch L (the pitch is a distance between the centers of the island-shaped patterns 50). That is, the island-shaped patterns 50 are periodically arranged. All the island-shaped patterns 50 may not be formed at equal pitch intervals, and most of the island-shaped patterns 50 (for example, 90% or greater, preferably 92% or greater, more preferably 95% or greater, further preferably 98% or greater of the island-shaped patterns 50) are only required to be formed at equal pitch intervals. That is, some of the island-shaped patterns 50 may not be arranged at equal pitch intervals. The island-shaped pattern 50 may not have a circular shape as viewed from above, and may have other shapes such as a rectangular shape or an elliptical shape. FIG. 4 is a top view illustrating the island-shaped patterns 50 having an elliptical shape as viewed from above.

The series resonators S1 through S4 have an identical ratio of the total of the areas (hereinafter, referred to as a total area) of the island-shaped patterns 50 to the area of the resonance region 36 as viewed from above. Similarly, the parallel resonators P1 through P3 have an identical ratio of the total area of the island-shaped patterns 50 to the area of the resonance region 36, for example. The ratios of the total areas of the island-shaped patterns 50 to the areas of the resonance regions 36 of the series resonators S1 through S4 may be equal to or different from those of the parallel resonators P1 through P3.

The series resonators S1 through S4 have an identical pitch interval of the island-shaped patterns 50. In contrast, at least two resonators of the parallel resonators P1 through P3 have different pitch intervals of the island-shaped patterns 50.

Accordingly, in the series resonators S1 through S4, the additional films 28 having, for example, the same pattern shape are formed. In the parallel resonators P1 through P3, the additional films 28 having different pattern shapes are formed in at least two resonators.

Figure 5A:
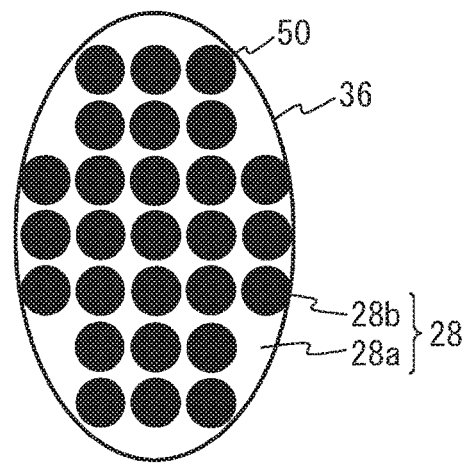
FIG. 5A is a top view of an example of the additional film of one resonator of the parallel resonators.
Figure 5B:
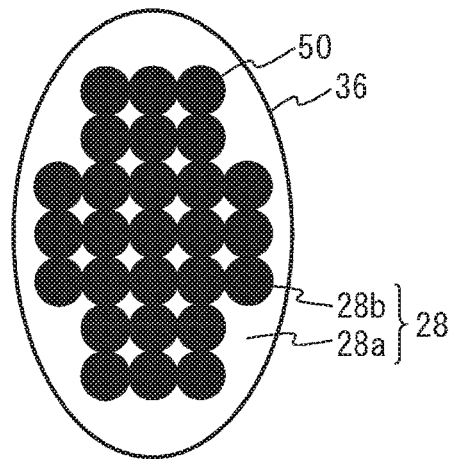
FIG. 5B and FIG. 5C are top views of examples of the additional film of another resonator.
Figure 5C:
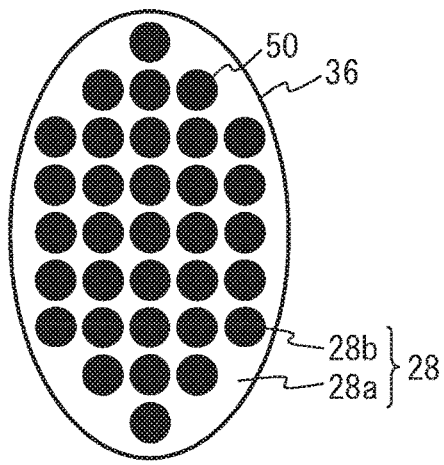

Here, the additional films 28 of at least two resonators of the parallel resonators P1 through P3 will be described with FIG. 5A through FIG. 5C. FIG. 5A is a top view of an example of the additional film 28 of one resonator of the parallel resonators P1 through P3, and FIG. 5B and FIG. 5C are top views of examples of the additional film 28 of another resonator. FIG. 5A through FIG. 5C illustrate the reduced number of the island-shaped patterns 50 to simplify the description.

In FIG. 5A, in the additional film 28, 27 island-shaped patterns 50 are formed at pitch intervals of 30 μm, for example. In FIG. 5B, in the additional film 28, 27 island-shaped patterns 50 having the same dimensions as the island-shaped pattern 50 of FIG. 5A are formed at pitch intervals of 25 μm, for example. In FIG. 5C, in the additional film 28, 33 island-shaped patterns 50 having different dimensions from the island-shaped pattern 50 of FIG. 5A are formed at pitch intervals of 25 μm, for example. As described above, the additional films 28 of at least two resonators of the parallel resonators P1 through P3 may be configured to contain the same number of the island-shaped patterns 50 of the same dimensions, to have an identical ratio of the total area of the island-shaped patterns 50 to the area of the resonance region 36, and to have different pitch intervals of the island-shaped patterns 50. Alternatively, the additional films 28 of at least two resonators of the parallel resonators P1 through P3 may be configured to contain different numbers of the island-shaped patterns 50 of different dimensions, to have an identical ratio of the total area of the island-shaped patterns 50 to the area of the resonance region 36, and to have different pitch intervals of the island-shaped patterns 50.

Figure 6A:
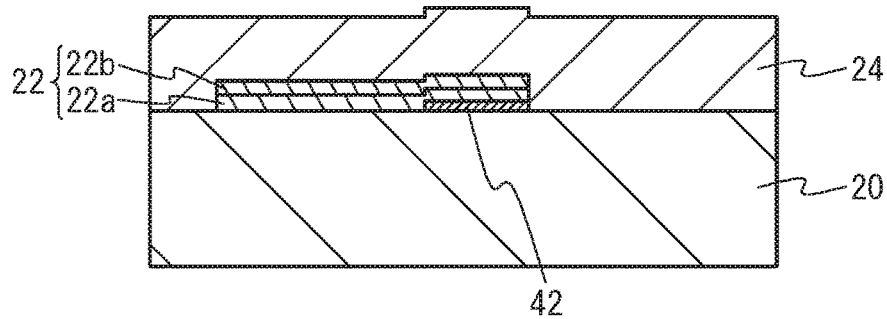
FIG. 6A through FIG. 6D are cross-sectional views illustrating a method of fabricating the series resonator.

Next a method of fabricating the series resonators S1 through S4 and the parallel resonators P1 through P3 will be described. FIG. 6A through FIG. 6D are cross-sectional views illustrating the method of fabricating the series resonators S1 through S4. As illustrated in FIG. 6A, a sacrifice layer 42 for forming the air gap 34 is formed on the flat upper surface of the substrate 20. The sacrifice layer 42 is formed by sputtering, vacuum evaporation, or Chemical Vapor Deposition (CVD). The sacrifice layer 42 may be formed of a material such as, for example, magnesium oxide (MgO), zinc oxide (ZnO), germanium (Ge), or silicon dioxide ($SiO_2$), which easily dissolves in an etching liquid or an etching gas. The sacrifice layer 42 is then patterned into a desired shape by photolithography and etching. The shape of the sacrifice layer 42 corresponds to the planar shape of the air gap 34, and includes, for example, a region to be the resonance region 36.

On the sacrifice layer 42 and the substrate 20, formed as the lower electrode 22 are the lower and upper layers 22a and 22b. The lower electrode 22 is formed by sputtering, vacuum evaporation, or CVD. The lower electrode 22 is then patterned into a desired shape by photolithography and etching. Then, the piezoelectric film 24 is formed on the lower electrode 22 and the substrate 20. The piezoelectric film 24 is formed by sputtering, vacuum evaporation, or CVD.

Figure 6B:
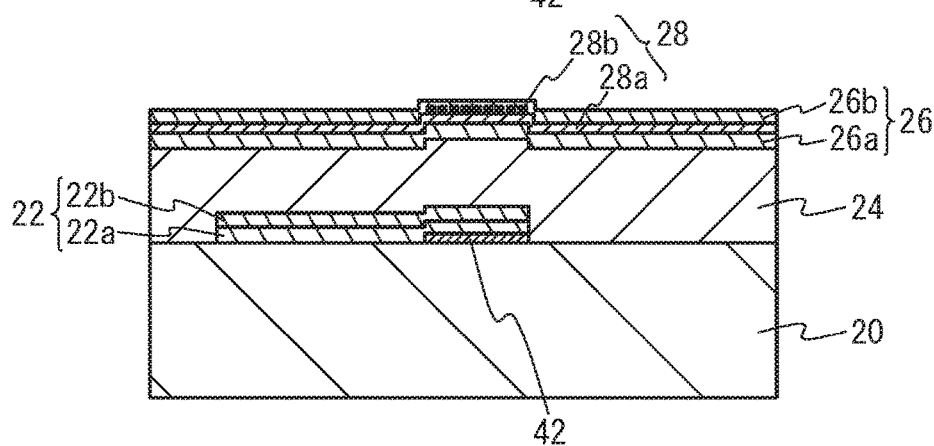

As illustrated in FIG. 6B, the lower layer 26a of the upper electrode 26 is formed on the piezoelectric film 24. Formed on the lower layer 26a of the upper electrode 26 are the lower and upper layers 28a and 28b of the additional film 28. The lower layer 26a of the upper electrode 26 and the lower and upper layers 28a and 28b of the additional film 28 are formed by sputtering, vacuum evaporation, or CVD. The upper layer 28b of the additional film 28 is then patterned into a desired shape by photolithography and etching. At this time, the pattern shapes of the island-shaped patterns 50 can be made different between the parallel resonators by using different mask patterns between the parallel resonators.

Then, the upper layer 26b of the upper electrode 26 is formed so as to cover the upper layer 28b of the additional film 28. The upper layer 26b of the upper electrode 26 is formed by sputtering, vacuum evaporation, or CVD.

Figure 6C:
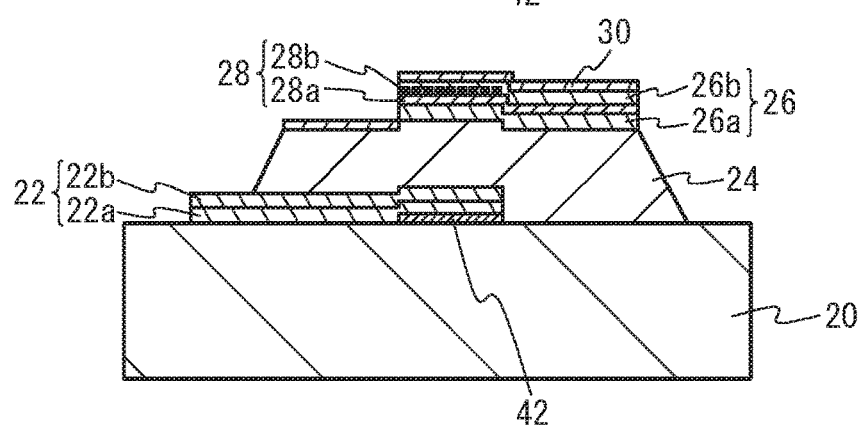

As illustrated in FIG. 6C, the upper electrode 26 and the additional film 28 are patterned into desired shapes by photolithography and etching. The first frequency adjusting film 30 is formed on the upper layer 26b of the upper electrode 26. The first frequency adjusting film 30 is formed by sputtering or CVD. The first frequency adjusting film 30 and the piezoelectric film 24 are patterned into desired shapes by photolithography and etching.

In the parallel resonators P1 through P3 illustrated in FIG. 2C, after the lower layer 26a of the upper electrode 26 is formed, the second frequency adjusting film 32 is formed by sputtering, vacuum evaporation, or CVD. The second frequency adjusting film 32 is patterned into a desired shape by photolithography and etching. Then, the lower layer 28a of the additional film 28 is formed.

Figure 6D:
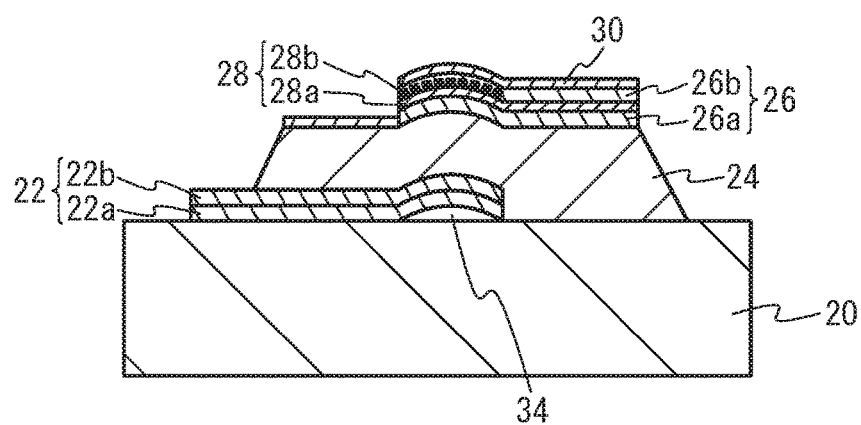

As illustrated in FIG. 6D, an etching liquid for etching the sacrifice layer 42 is introduced through the hole portion 40 and the introduction path 38 (see FIG. 2A) to remove the sacrifice layer 42. The substance for etching the sacrifice layer 42 is preferably a substance that does not etch materials making up the resonator except the sacrifice layer 42. For example, the substance for etching is preferably a substance that does not etch the lower electrode 22 or the piezoelectric film 24 with which the substance for etching contacts. The adjustment of the film forming condition makes it possible to set the stress of the multilayered film including the lower electrode 22, the piezoelectric film 24, and the upper electrode 26 to a compression stress, and when the sacrifice layer 42 is removed, the multilayered film bulges out to the opposite side of the substrate 20 to separate from the substrate 20. This process forms the air gap 34 having a dome-shaped bulge between the substrate 20 and the lower electrode 22. The process including the above steps forms the series resonators S1 through S4 and the parallel resonators P1 through P3.

Next, experiments conducted by the inventors will be described. The inventors formed the acoustic wave filter 100 of the first embodiment having the following structure to measure the pass characteristic. That is, in the series resonators S1 through S4 and the parallel resonators P1 through P3, the substrate 20 was a Si substrate, the lower layer 22a of the lower electrode 22 was a Cr film with a film thickness of 0.07 to 0.12 µm, and the upper layer 22b was a Ru film with a film thickness of 0.15 to 0.30 µm. The piezoelectric film 24 was an AlN film with a film thickness of 0.9 to 1.5 µm. The lower layer 26a of the upper electrode 26 was a Ru film with a film thickness of 0.15 to 0.30 µm, and the upper layer 26b was a Cr film with a film thickness of 0.03 to 0.06 µm. The lower layer 28a of the additional film 28 was a Ru film with a film thickness of 5 to 22 nm, and the upper layer 28b was a Ti film with a film thickness of 0.05 to 0.10 µm. The first frequency adjusting film 30 was a $SiO_2$ film with a film thickness of 0.05 to 0.11 µm. The second frequency adjusting film 32 was a Ti film with a film thickness of 0.07 to 0.13 µm.

The additional films 28 of the series resonators S1 through S4 were configured to have different ratios of the total area of the island-shaped patterns 50 to the area of the resonance region 36 within the range from greater than 0% to 50%, and have the same pitch interval (5.5 nm) of the island-shaped patterns 50.

The additional films 28 of the parallel resonators P2 and P3 were configured to have different ratios of the total area of the island-shaped patterns 50 to the area of the resonance region 36 within the range from greater than 0% to 50%, and have the same pitch interval (5.5 nm) of the island-shaped patterns 50. In contrast, the additional film 28 of the parallel resonator P1 was configured to have the same ratio of the total area of the island-shaped patterns 50 to the area of the resonance region 36 as one of the parallel resonators P2 and P3, and have a pitch interval of the island-shaped patterns 50 less or greater than those of the parallel resonators P2 and P3 by 4% (5.3 nm or 5.7 nm).

Figure 7A:
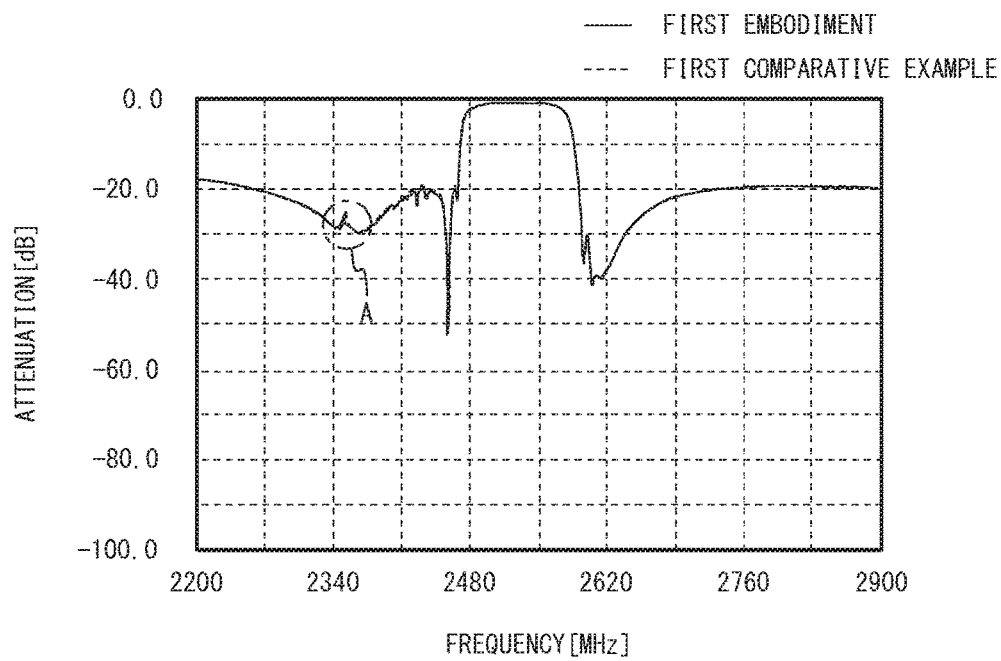
FIG. 7A and FIG. 7B are diagrams (No. 1) illustrating the measurement results of a pass characteristic.
Figure 7B:
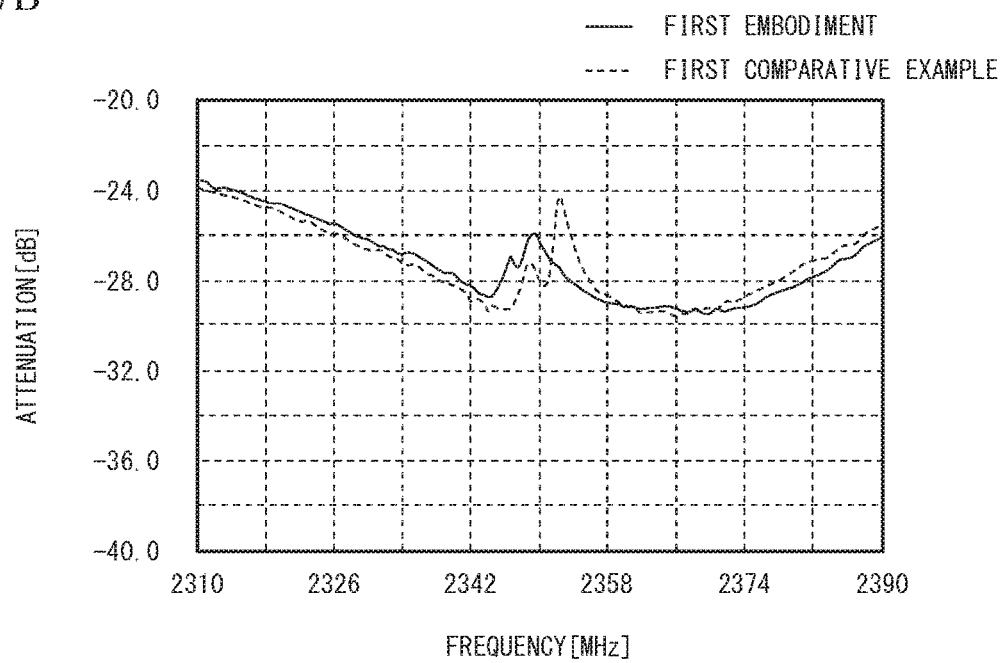
Figure 8A:
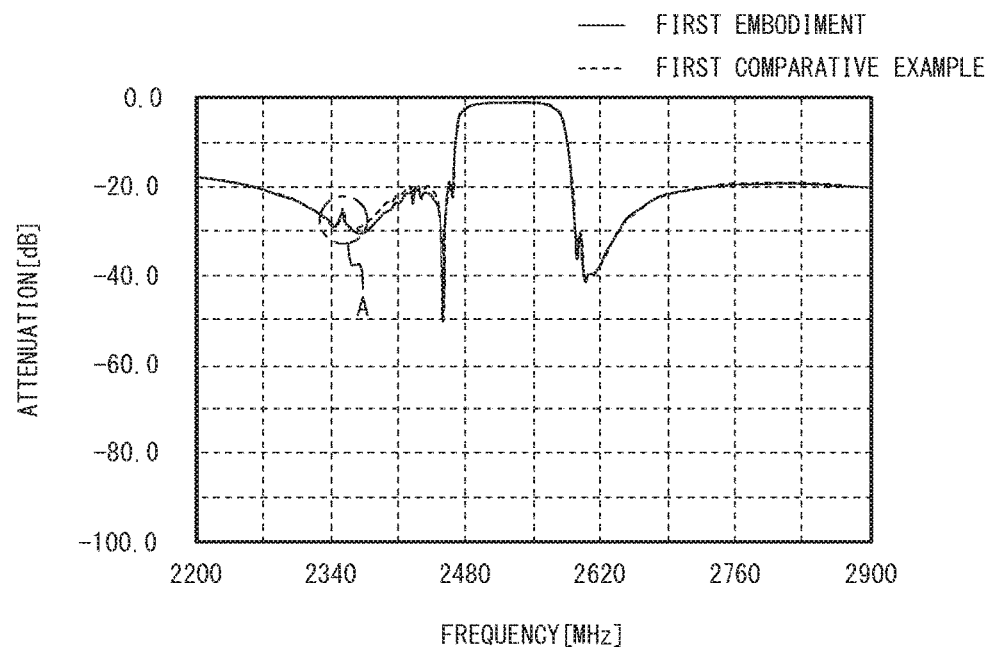
FIG. 8A and FIG. 8B are diagrams (No. 2) illustrating the measurement results of the pass characteristic.
Figure 8B:
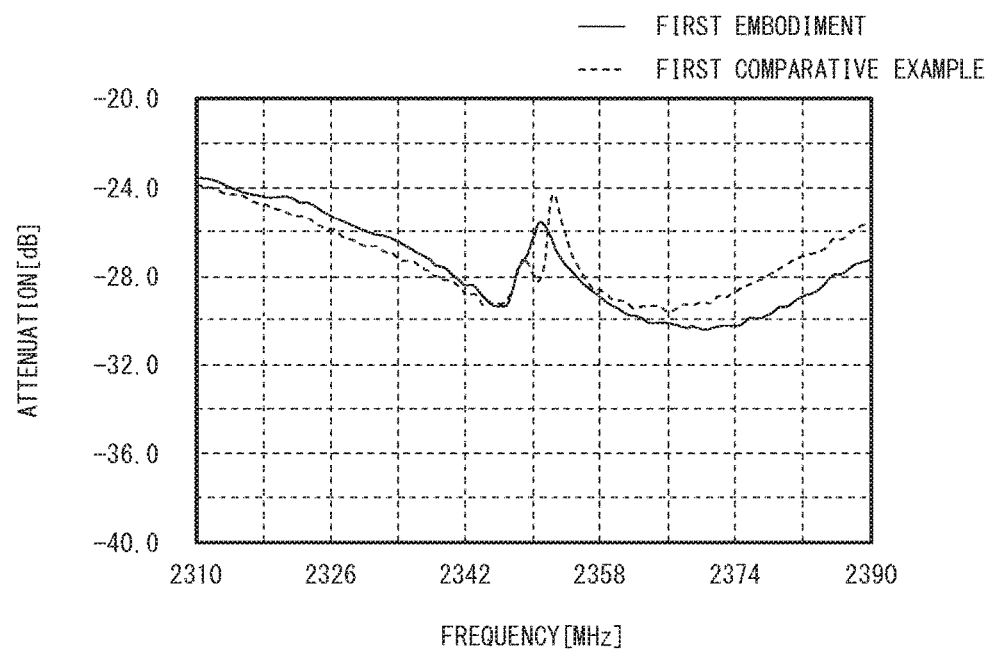

FIG. 7A through FIG. 8B illustrate the measurement results of the pass characteristic. FIG. 7A illustrates the measurement result when the pitch interval of the island-shaped patterns 50 of the additional film 28 of the parallel resonator P1 was less than those of the parallel resonators P2 and P3 by 4%, and FIG. 7B is an enlarged view of the region A in FIG. 7A. FIG. 8A illustrates the measurement result when the pitch interval of the island-shaped patterns 50 of the additional film 28 of the parallel resonator P1 was greater than those of the parallel resonators P2 and P3 by 4%, and FIG. 8B is an enlarged view of the region A in FIG. 8A. FIG. 7A through FIG. 8B also illustrate, for comparison, the measurement results of the pass characteristic of an acoustic wave filter of a first comparative example that configures the pitch interval of the island-shaped patterns 50 of the additional film 28 of the parallel resonator P1 to be equal to those of the parallel resonators P2 and P3.

As illustrated in FIG. 7A through FIG. 8B, when the pitch interval of the island-shaped patterns 50 of the additional film 28 of the parallel resonator P1 is less or greater than those of the parallel resonators P2 and P3 by 4%, spurious in the attenuation band is reduced. The reason why spurious is reduced by making the pitch interval of the island-shaped patterns 50 of the additional film 28 of the parallel resonator P1 different from those of the parallel resonators P2 and P3 is considered as follows. That is, the frequency of spurious occurring in a resonator correlates with the pitch interval of the island-shaped patterns 50 of the additional film 28. Thus, when the parallel resonators P1 through P3 have an identical pitch interval of the island-shaped patterns 50 of the additional films 28, spurious occurs at approximately the same frequency. In this case, spuriouses increase each other, causing large spurious to appear. This is considered the reason why large spurious occurred in the attenuation band in the first comparative example. In contrast, in the first embodiment, the pitch interval of the island-shaped patterns 50 of the additional film 28 of the parallel resonator P1 is made different from those of the parallel resonators P2 and P3. Thus, spurious occurs at different frequencies between the parallel resonator P1 and the parallel resonators P2 and P3, and spuriouses are inhibited from increasing each other. As the result, spurious occurring in the attenuation band is reduced.

As described above, in the first embodiment, the pitch interval of the island-shaped patterns 50 in the additional film 28 of one of at least two resonators of the parallel resonators P1 through P3 differs from the pitch interval of the island-shaped patterns 50 in the additional film 28 of another one of the at least two resonators of the parallel resonators P1 through P3. This configuration allows, as described in FIG. 7A through FIG. 8B, spurious to occur at different frequencies among the resonators. Therefore, spuriouses are inhibited from increasing each other, and spurious is thus reduced.

When the parallel resonators P1 through P3 have an identical resonant frequency and an identical pitch interval of the island-shaped patterns 50, spuriouses occur at approximately the same frequency among the resonators. Accordingly, large spurious easily occurs. Therefore, in such a case, at least two resonators of the parallel resonators P1 through P3 are preferably configured to have different pitch intervals of the island-shaped patterns 50 of the additional films 28. The term "identical resonant frequency" is not limited to resonant frequencies completely equal to each other, and may be resonant frequencies equal to each other to the extent that spuriouses occurring when the pitch intervals of the island-shaped patterns 50 are the same overlap each other.

When the pitch interval of the island-shaped patterns 50 is less than the wavelength of the acoustic wave excited by the piezoelectric film 24, the changing amount of the frequency at which spurious occurs is small even though the pitch interval is changed. In contrast, when the pitch interval of the island-shaped patterns 50 is equal to or greater than the wavelength of the acoustic wave, the frequency at which spurious occurs greatly changes when the pitch interval is changed. Thus, the pitch interval of the island-shaped patterns 50 is preferably equal to or greater than the wavelength of the acoustic wave excited by the piezoelectric film 24. The same applies to aperture patterns 52 described later.

As illustrated in FIG. 5A and FIG. 5B, the ratio of the total area of the island-shaped patterns 50 to the area of the resonance region 36 in the additional film 28 of one of at least two resonators of the parallel resonators P1 through P3 may be equal to the ratio of the total area of the island-shaped patterns 50 to the area of the resonance region 36 in the additional film 28 of another one of the at least two resonators, and the dimensions of the island-shaped patterns 50 in the additional film 28 of the one of the at least two resonators may be equal to the dimensions of the island-shaped patterns 50 in the additional film 28 of the another one of the at least two resonators as viewed from above. When the ratios of the total area of the island-shaped patterns 50 to the area of the resonance region 36 are equal to each other, the resonant frequencies of the at least two resonators are approximately equal to each other. Thus, large spurious easily appears. However, the production tolerance of the island-shaped patterns 50 can be reduced by making the dimensions of the island-shaped patterns 50 equal to each other between the additional films 28 of the at least two resonators. Thus, the different pitch intervals can make frequencies at which spurious occurs different precisely, reducing spurious.

As illustrated in FIG. 5A and FIG. 5C, the ratio of the total area of the island-shaped patterns 50 to the area of the resonance region 36 in the additional film 28 of one of at least two resonators of the parallel resonators P1 through P3 may be equal to the ratio of the total area of the island-shaped patterns 50 to the area of the resonance region 36 in the additional film 28 of another one of the at least two resonators, and the dimensions of the island-shaped patterns 50 in the additional film 28 of the one of the at least two resonators may differ from the dimensions of the island-shaped patterns 50 in the additional film 28 of the another one of the at least two resonators as viewed from above. Making the dimensions of the island-shaped patterns 50 different from each other between the additional films 28 of the at least two resonators reduces the restrictions on the variable amount of the pitch interval, and allows the island-shaped patterns 50 to be formed in the whole of the resonance region 36. Therefore, spurious is reduced.

The case where the ratios of the total area of the island-shaped patterns 50 to the area of the resonance region 36 are equal to each other between the additional films 28 of the at least two resonators is not limited to the case where the ratios are completely equal to each other, and may include the case where the ratios are equal to each other to the extent that the resonant frequency is not affected. For example, the ratios of the total area of the island-shaped patterns 50 to the area of the resonance region 36 may be equal to each other to the extent that spuriouses occurring when the pitch intervals of the island-shaped patterns 50 are equal to each other overlap each other.

In the first embodiment, all the parallel resonators P1 through P3 may have different pitch intervals of the island-shaped patterns 50 of the additional films 28. This configuration makes frequencies at which spurious occurs different from each other among all the parallel resonators P1 through P3. Therefore, spurious is further reduced.

The first embodiment has described an exemplary case where at least two resonators of the parallel resonators P1 through P3 have different pitch intervals of the island-shaped patterns 50 of the additional films 28. However, at least two resonators of the series resonators S1 through S4 may have different pitch intervals of the island-shaped patterns 50 of the additional films 28. This configuration can also reduce spurious. As in the parallel resonator, to further reduce spurious, the series resonators S1 through S4 may have different pitch intervals of the island-shaped patterns 50 of the additional films 28. The pitch intervals of the island-shaped patterns 50 of the additional films 28 may differ from each other between at least two resonators of the parallel resonators P1 through P3 and between at least two resonators of the series resonators S1 through S4.

Figure 9A:
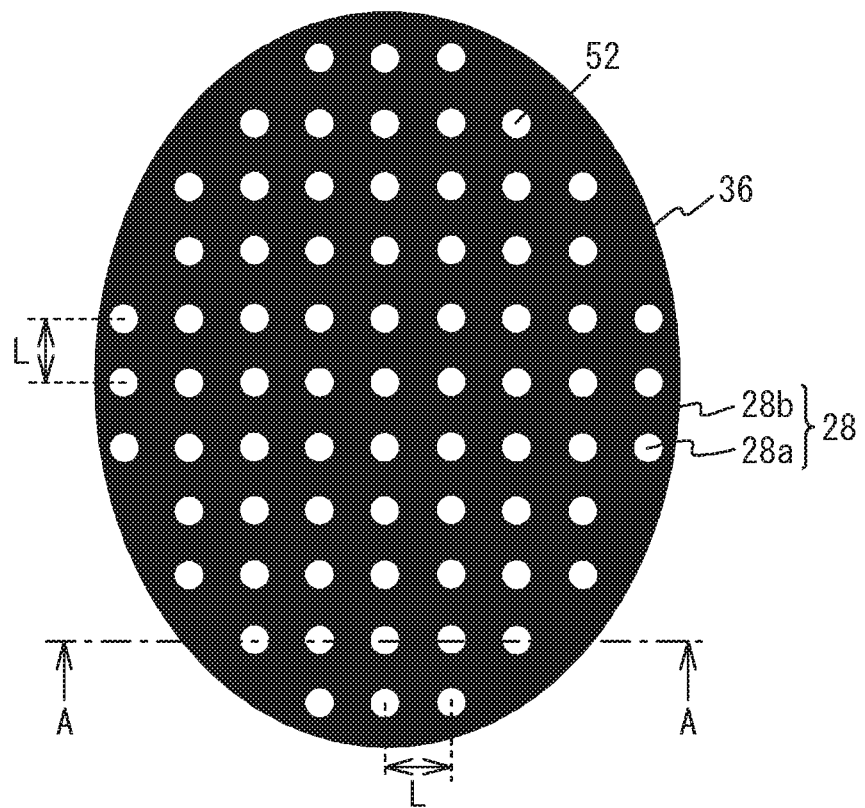
FIG. 9A is a top view of another example of the additional film.
Figure 9B:
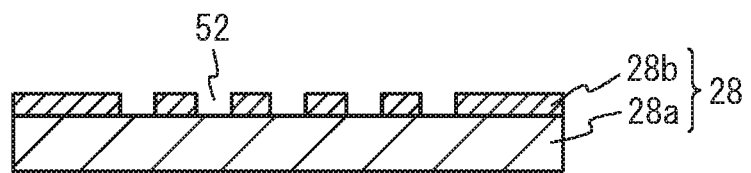
FIG. 9B is a cross-sectional view taken along line A-A in FIG. 9A.

In the first embodiment, in the additional film 28, the aperture patterns 52 may be formed instead of the island-shaped patterns 50. FIG. 9A is a top view of another example of the additional film 28, and FIG. 9B is a cross-sectional view taken along line A-A in FIG. 9A. As illustrated in FIG. 9A and FIG. 9B, the additional film 28 may have, instead of the island-shaped patterns 50, the aperture patterns 52. For example, the additional film 28 may have a structure in which the upper layer 28b in which the aperture patterns 52 are patterned is formed on the flat upper surface of the lower layer 28a. The aperture patterns 52 are formed to have an identical dimension as viewed from above and to be arranged at equal intervals of a pitch L. That is, the aperture patterns 52 are periodically arranged. All the aperture patterns 52 may not be formed at equal pitch intervals, and most of the aperture patterns 52 (for example, 90% or greater, preferably 92% or greater, more preferably 95% or greater, further preferably 98% or greater of the aperture patterns 52) are only required to be formed at equal pitch intervals. That is, some of the aperture patterns 52 may not be formed at equal pitch intervals. The shape of the aperture pattern 52 is not limited to a circular shape as viewed from above, and may be other shapes such as a rectangular shape or an elliptical shape.

When the additional film 28 have the aperture patterns 52, at least two resonators of the parallel resonators P1 through P3 have different pitch intervals of the aperture patterns 52. Alternatively, at least two resonators of the series resonators S1 through S4 have different pitch intervals of the aperture patterns 52. The additional films 28 of the at least two resonators may have an identical ratio of the total area of the aperture patterns 52 to the area of the resonance region 36, and have an identical dimension or different dimensions of the aperture patterns 52 as viewed from above.

Figure 10A:
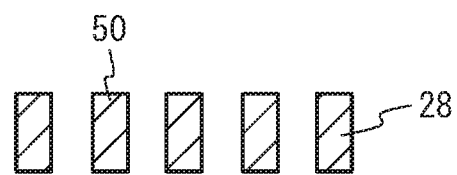
FIG. 10A is a cross-sectional view of an alternative example of the island-shaped patterns of the additional film.
Figure 10B:
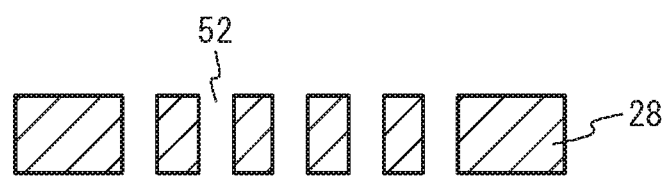
FIG. 10B is a cross-sectional view of an alternative example of aperture patterns of the additional film.

In the first embodiment, the structure of the additional film 28 is not limited to a two-layer structure, and may be a single-layer structure or a multilayer structure including three or more layers. When the additional film 28 has the island-shaped patterns 50, as illustrated in FIG. 10A, the island-shaped patterns 50 may be isolated-patterns that are not interconnected by the additional film 28. When the additional film 28 has the aperture patterns 52, as illustrated in FIG. 10B, the aperture patterns 52 may penetrate through the additional film 28.

In the first embodiment, when the additional film 28 has the island-shaped patterns 50, a ratio S' of the total area of the island-shaped patterns 50 to the area S of the resonance region 36 is preferably greater than 0 and less than 0.5S (0<S'<0.5S). When the additional film 28 has the aperture patterns 52, a ratio S' of the value obtained by subtracting the total area of the aperture patterns 52 from the area S of the resonance region 36 to the area of the resonance region 36 is preferably greater than 0.5S and less than S (0.5S<S'<S). This configuration inhibits the degradation of the Q-value.

The series resonators S1 through S4 may have an identical resonant frequency or different resonant frequencies. The parallel resonators P1 through P3 may have an identical resonant frequency or different resonant frequencies. When the series resonators are configured to have different resonant frequencies and/or the parallel resonators are configured to have different resonant frequencies, a filter characteristic of low-loss and wide band is achieved.

In the first embodiment, the additional film 28 may be formed other than between the lower and upper layers 26a and 26b of the upper electrode 26. FIG. 11A through FIG. 12B are cross-sectional views of variations of the series resonator. Here, the series resonator is illustrated, but the same applies to the parallel resonator. The additional film 28 having island-shaped patterns and a single-layer structure is illustrated, but the same applies to the additional film 28 having a stacked layer structure or aperture patterns.

Figure 11A:
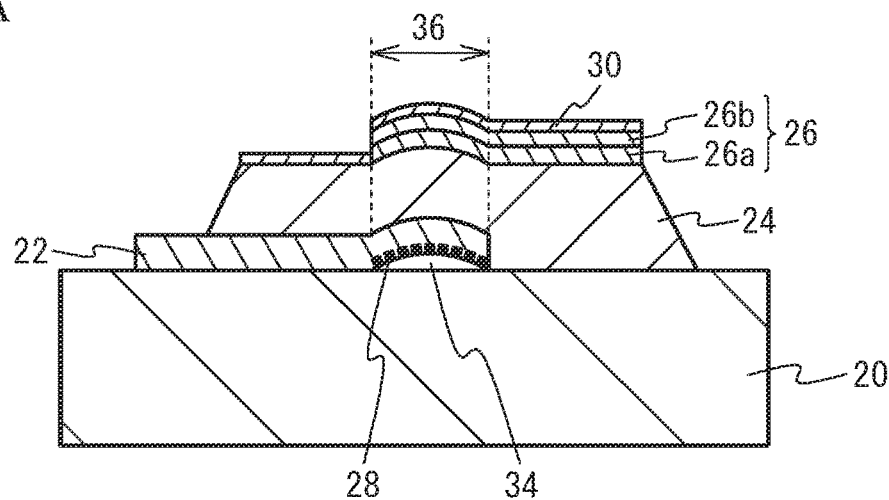
FIG. 11A through FIG. 11C are cross-sectional views (No. 1) of variations of the series resonator.
Figure 11B:
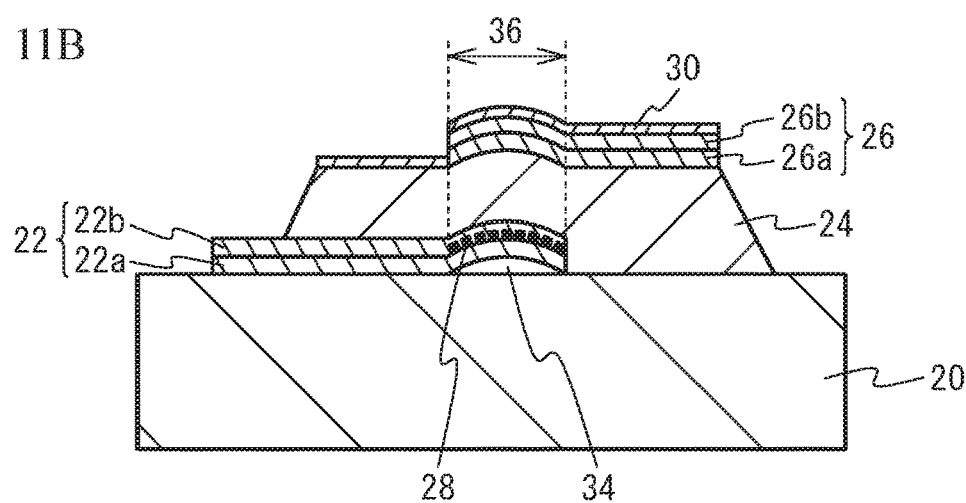
Figure 11C:
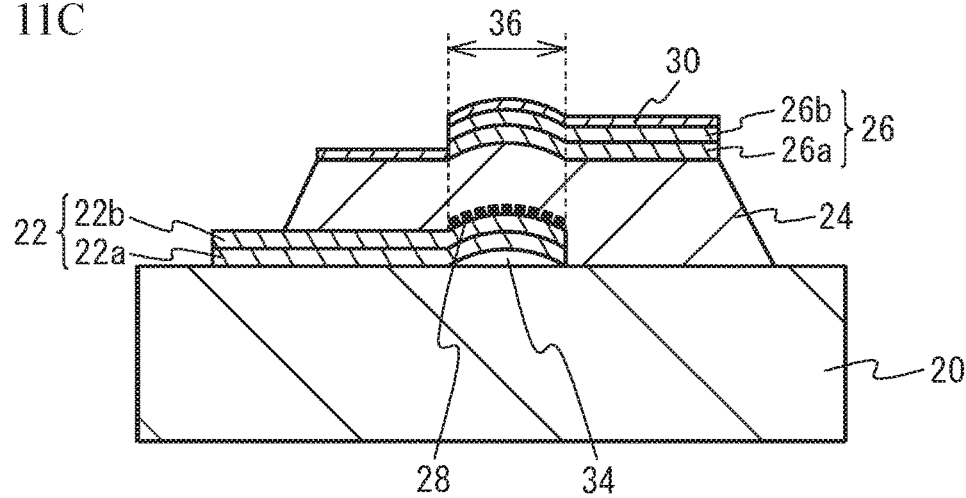
Figure 12A:
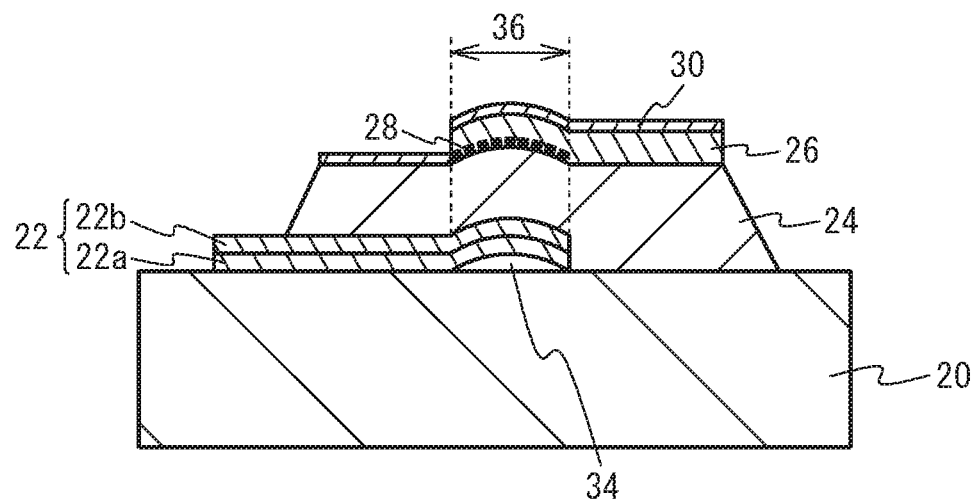
FIG. 12A and FIG. 12B are cross-sectional views (No. 2) of variations of the series resonator.
Figure 12B:
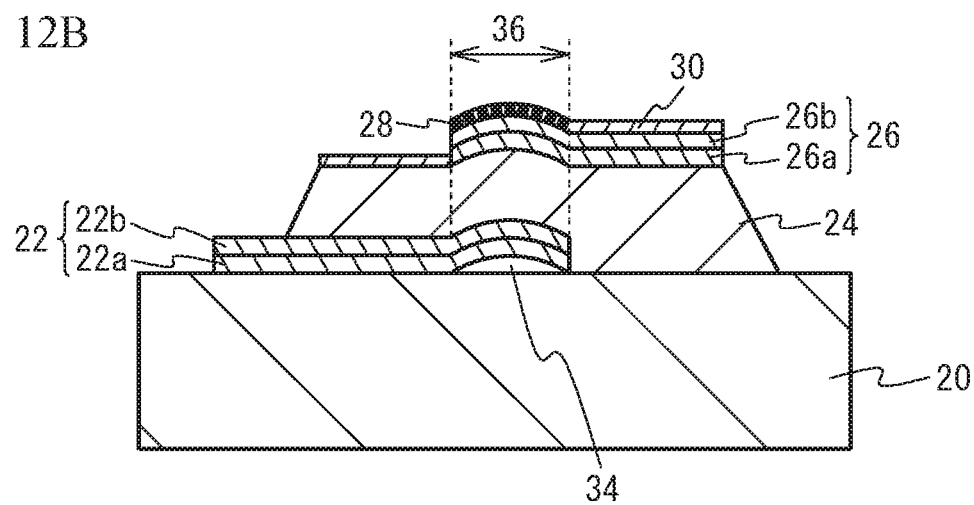

As illustrated in FIG. 11A, the additional film 28 may be located below the lower electrode 22. As illustrated in FIG. 11B, the additional film 28 may be located between the lower and upper layers 22a and 22b of the lower electrode 22. As illustrated in FIG. 11C, the additional film 28 may be located between the lower electrode 22 and the piezoelectric film 24. As illustrated in FIG. 12A, the additional film 28 may be located between the piezoelectric film 24 and the upper electrode 26. As illustrated in FIG. 12B, the additional film 28 may be located on the upper electrode 26. The additional film 28 may be larger than the resonance region 36 as long as it is formed to include the whole of the resonance region 36.

The first embodiment has described an exemplary case where the filter is a ladder-type filter in which the series resonators S1 through S4 and the parallel resonators P1 through P3 are connected in a ladder form, but the filter may be a lattice-type filter.

Figure 13A:
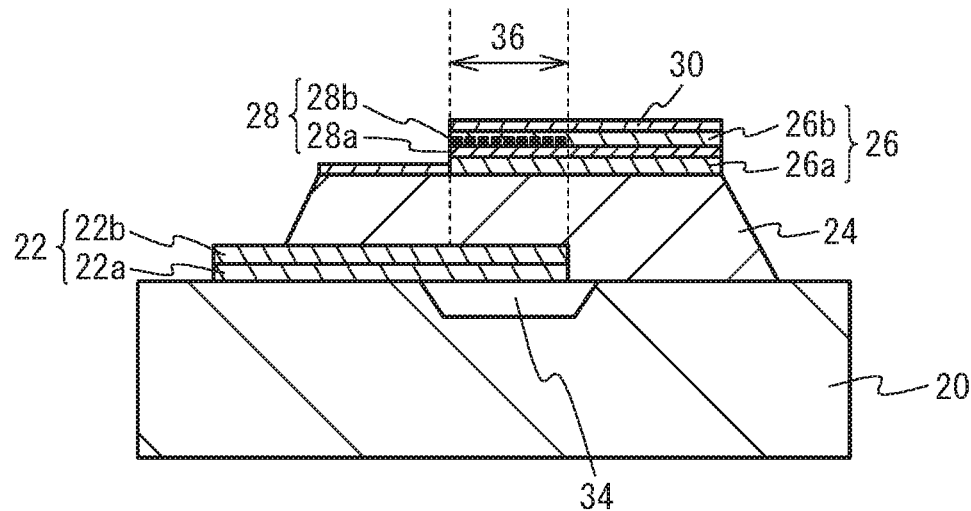
FIG. 13A and FIG. 13B are cross-sectional views (No. 3) of variations of the series resonator.
Figure 13B:
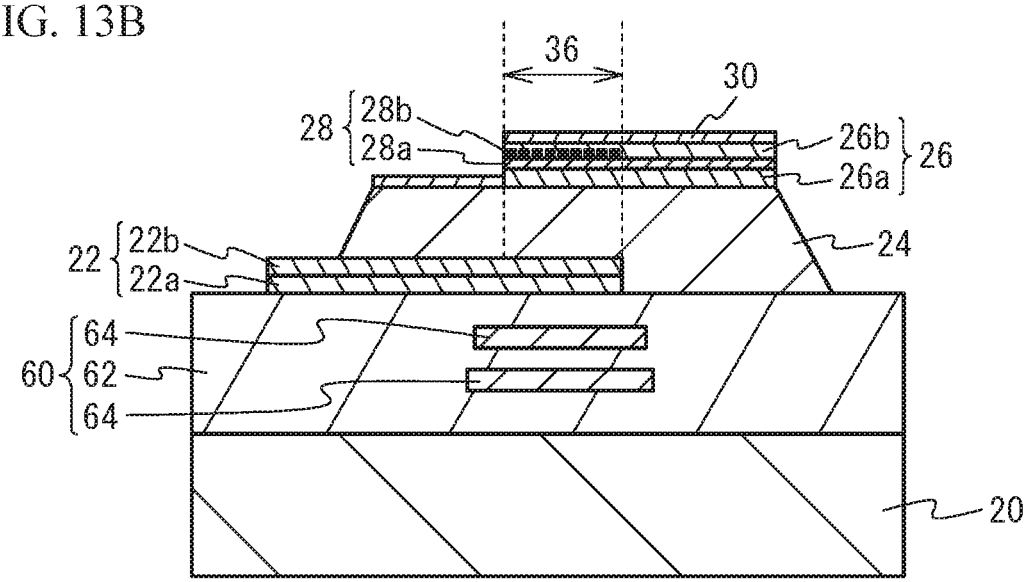

The first embodiment has described an exemplary case where each of the series resonators S1 through S4 and the parallel resonators P1 through P3 includes the dome-shaped air gap 34 formed, as illustrated in FIG. 2B and FIG. 2C, between the flat upper surface of the substrate 20 and the lower electrode 22, but does not intend to suggest any limitation. FIG. 13A and FIG. 13B are cross-sectional views of variations of the series resonator. Here, the series resonator is illustrated, but the same applies to the parallel resonator.

As illustrated in FIG. 13A, a recessed portion may be formed in the upper surface of the substrate 20 in the resonance region 36 to form the air gap 34. The recessed portion may not penetrate through the substrate 20, or may penetrate through the substrate 20. As illustrated in FIG. 13B, instead of the air gap 34, an acoustic mirror 60 may be located below the lower electrode 22 in the resonance region 36. The acoustic mirror 60 is a film that reflects an acoustic wave propagating through the piezoelectric film 24, and is formed by alternately stacking a film 62 with a low acoustic impedance and a film 64 with a high acoustic impedance.

As described above, the series resonators S1 through S4 and the parallel resonators P1 through P3 may be Film Bulk Acoustic Resonators (FBARs) in which the air gap 34 is located below the lower electrode 22 in the resonance region 36, or Solidly Mounted Resonators (SMRs) including the acoustic mirror 60 located below the lower electrode 22 in the resonance region 36.

In the first embodiment, the lower surface of the substrate 20 may be bonded to the upper surface of the support substrate. The support substrate may be, for example, a silicon substrate, a sapphire substrate, or an alumina substrate.

Second Embodiment

Figure 14:
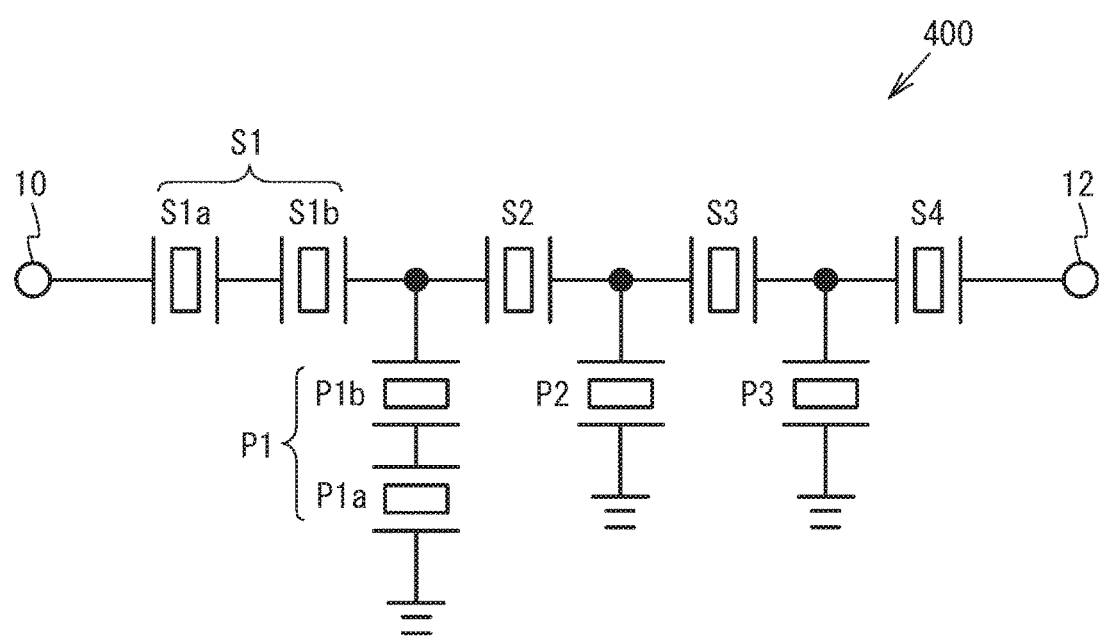
FIG. 14 illustrates an acoustic wave filter in accordance with a second embodiment.

FIG. 14 illustrates an acoustic wave filter 400 in accordance with a second embodiment. As illustrated in FIG. 14, in the acoustic wave filter 400 of the second embodiment, the series resonator S1 is divided into a first divided resonator S1a and a second divided resonator S1b. The resonator located in a line connecting the input terminal 10 and the output terminal 12 is a series resonator. Thus, the first and second divided resonators S1a and S1b are series resonators. The first and second divided resonators S1a and S1b are connected in series to each other. The first and second divided resonators S1a and S1b have an approximately identical resonant frequency and have capacitances twice the capacitance of the series resonator S1 before division. Similarly, the parallel resonator P1 is divided into a first divided resonator P1a and a second divided resonator P1b. The resonator located between a line connecting the input terminal 10 and the output terminal 12 and a ground is a parallel resonator. Thus, the first and second divided resonators P1a and P1b are parallel resonators. The first and second divided resonators P1a and P1b are connected in series to each other. The first and second divided resonators P1a and P1b have an approximately identical resonant frequency, and have capacitances twice the capacitance of the parallel resonator P1 before division.

Each of the first divided resonator S1a, the second divided resonator S1b, the first divided resonator P1a, and the second divided resonator P1b includes the additional film 28 having the island-shaped patterns 50 illustrated in FIG. 3A and FIG. 3B. The first and second divided resonators S1a and S1b have approximately the same total area of the island-shaped patterns 50, and different pitch intervals of the island-shaped patterns 50. The first and second divided resonators P1a and P1b have approximately the same total area of the island-shaped patterns 50, and different pitch intervals of the island-shaped patterns 50. This configuration inhibits spuriouses from increasing each other between the first and second divided resonators S1a and S1b. Spuriouses are inhibited from increasing each other also between the first and second divided resonators P1a and P1b.

As described in the second embodiment, one series resonator S1 may be divided into the first and second divided resonators S1a and S1b connected in series to each other, and the first and second divided resonators S1a and S1b may have different pitch intervals of the island-shaped patterns 50. In addition, one parallel resonator P1 may be divided into the first and second divided resonators P1a and P1b connected in series to each other, and the first and second divided resonators P1a and P1b may have different pitch intervals of the island-shaped patterns 50.

The second embodiment has described an exemplary case where both the series resonator and the parallel resonator are divided. But only one of the series resonator and the parallel resonator may be divided.

Figure 15:
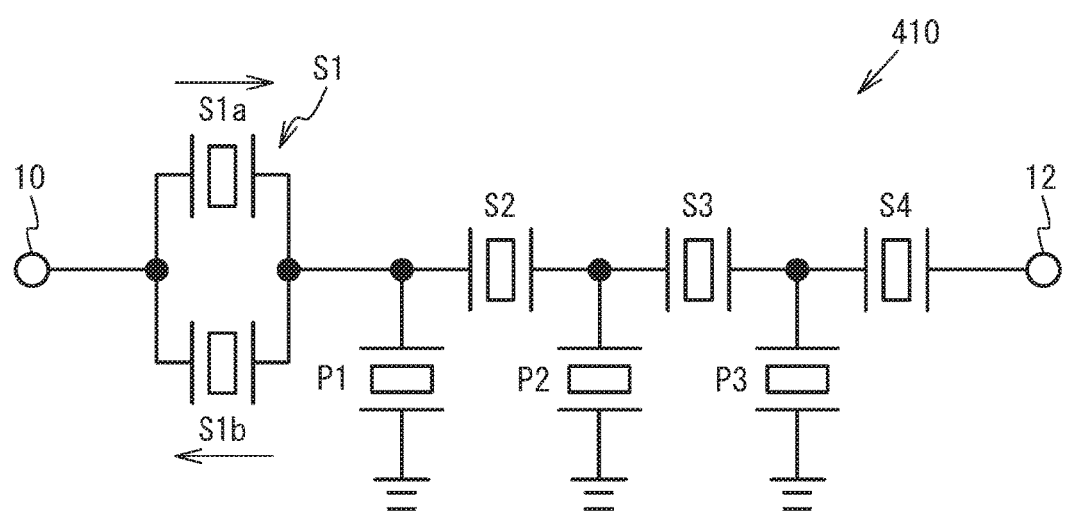
FIG. 15 illustrates an acoustic wave filter in accordance with a first variation of the second embodiment.

The second embodiment has described an exemplary case where each of the series resonator and the parallel resonator is divided into divided resonators connected in series to each other, but does not intend to suggest any limitation. FIG. 15 illustrates an acoustic wave filter 410 in accordance with a first variation of the second embodiment. As illustrated in FIG. 15, the series resonator S1 may be divided into the first and second divided resonators S1a and S1b connected in parallel to each other. In this case, the first and second divided resonators S1a and S1b have approximately the same resonant frequency, and have capacitances approximately half the capacitance of the series resonator S1 before division. Arrows illustrated at the sides of the first and second divided resonators S1a and S1b indicate the direction in which a secondary distortion voltage is applied. As illustrated, the directions in which the secondary distortion voltage is applied may be opposite directions or the same direction between the first and second divided resonators S1a and S1b. The same applies to the parallel resonator.

Third Embodiment

Figure 16:
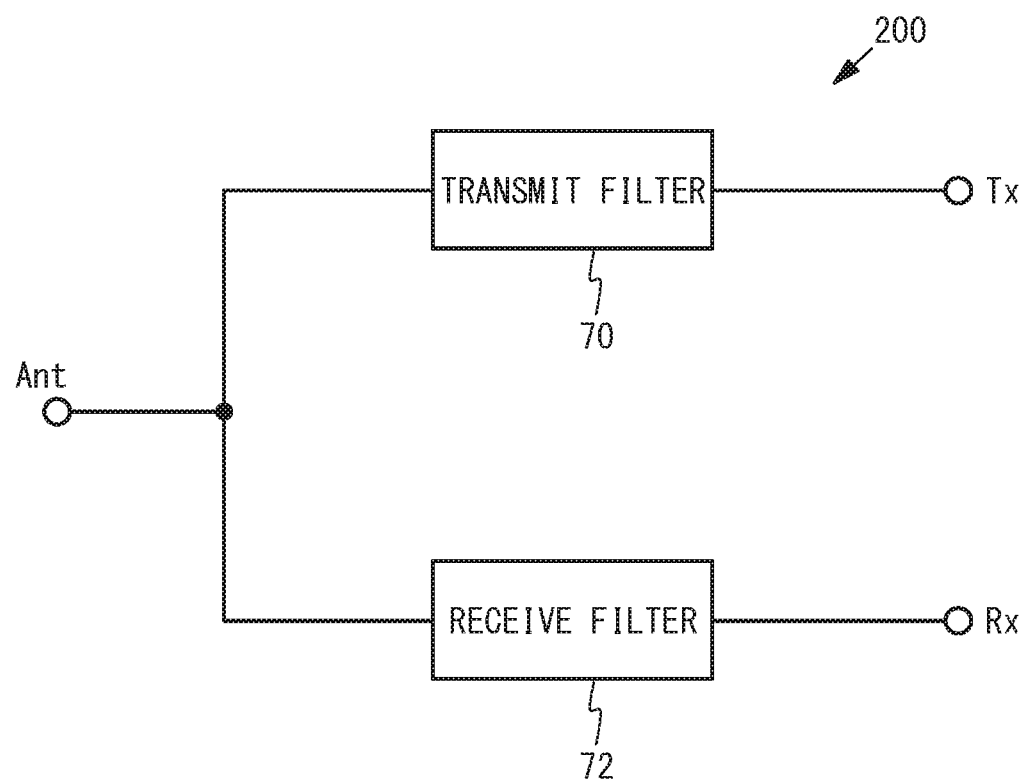
FIG. 16 is a block diagram of a duplexer in accordance with a third embodiment.

FIG. 16 is a block diagram of a duplexer 200 in accordance with a third embodiment. As illustrated in FIG. 16, the duplexer 200 of the third embodiment includes a transmit filter 70 and a receive filter 72. The transmit filter 70 is connected between an antenna terminal Ant and a transmit terminal Tx. The receive filter 72 is connected between the antenna terminal Ant, shared with the transmit filter 70, and a receive terminal Rx.

The transmit filter 70 passes signals within the transmit band, among signals input from the transmit terminal Tx, to the antenna terminal Ant as transmission signals, and suppresses signals with other frequencies. The receive filter 72 passes signals within the receive band, among signals input from the antenna terminal Ant, to the receive terminal Rx as reception signals, and suppresses signals with other frequencies. The transmit band and the receive band have different frequencies. A matching circuit for matching impedance may be provided to output a transmission signal passing through the transmit filter 70 from the antenna terminal Ant without leaking to the receive filter 72.

At least one of the transmit filter 70 and the receive filter 72 included in the duplexer 200 of the third embodiment may be the acoustic wave filter described in the first embodiment.

Fourth Embodiment

Figure 17:
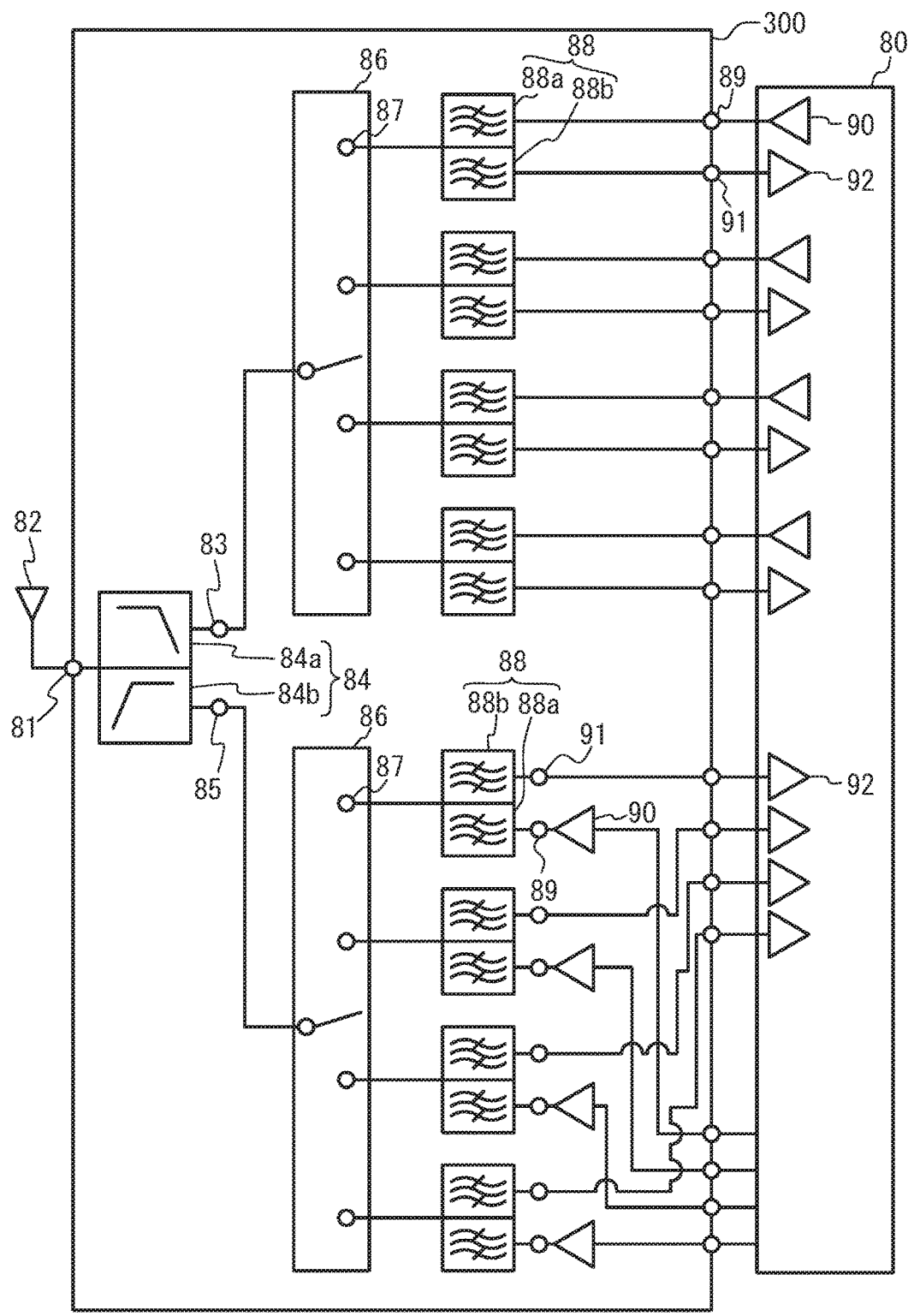
FIG. 17 is a block diagram of a mobile communication device including a module in accordance with a fourth embodiment.

FIG. 17 is a block diagram of a mobile communication device including a module 300 in accordance with a fourth embodiment. As illustrated in FIG. 17, the mobile communication device includes the module 300 that is a transceiver device, an integrated circuit 80, and an antenna 82. The module 300 includes a diplexer 84, switches 86, duplexers 88, and power amplifiers 90. The diplexer 84 includes a low-pass filter (LPF) 84a and a high-pass filter (HPF) 84b. The LPF 84a is connected between terminals 81 and 83. The HPF 84b is connected between terminals 81 and 85. The terminal 81 is connected to the antenna 82. The LPF 84a passes low-frequency signals of signals transmitted from/received by the antenna 82, and suppresses high-frequency signals. The HPF 84b passes high-frequency signals of signals transmitted from/received by the antenna 82, and suppresses low-frequency signals.

The switches 86 connect the terminals 83 and 85 to one of terminals 87. The duplexer 88 includes a transmit filter 88a and a receive filter 88b. The transmit filter 88a is connected between terminals 87 and 89. The receive filter 88b is connected between terminals 87 and 91. The transmit filter 88a passes signals within the transmit band, and suppresses other signals. The receive filter 88b passes signals within the receive band, and suppresses other signals. The power amplifier 90 amplifies and outputs transmission signals to the terminal 89. A low noise amplifier 92 amplifies reception signals output to the terminal 91.

The module 300 that is a transceiver device may employ the acoustic wave filter described in the first embodiment as the transmit filter 88a or the receive filter 88b of the duplexer 88. The module 300 may include the power amplifier 90 and/or the low noise amplifier 92.

As described above, the acoustic wave filter described in the first embodiment may form a transceiver device that is connected to the antenna 82, mounted on a motherboard together with the power amplifier 90, and transmits and receives communication signals.

Although the embodiments of the present invention have been described in detail, it is to be understood that the various change, substitutions, and alterations could be made hereto without departing from the spirit and scope of the invention.

What is claimed is:

1. An acoustic wave filter comprising:
   one or more series resonators connected in series between an input terminal and an output terminal; and
   parallel resonators connected in parallel between the input terminal and the output terminal and formed of piezoelectric thin film resonators,
   wherein each of at least two resonators of the parallel resonators includes an additional film having island-shaped patterns or aperture patterns formed at equal pitch intervals in a resonance region in which a lower electrode and an upper electrode face each other across a piezoelectric film, and
   wherein a pitch interval of the island-shaped patterns or the aperture patterns in the additional film included in one of the at least two resonators differs from a pitch interval of the island-shaped patterns or the aperture patterns in the additional film included in another one of the at least two resonators, and a dimension of the island-shaped patterns or the aperture patterns in the additional film included in the one of the at least two resonators is equal to a dimension of the island-shaped patterns or the aperture patterns in the additional film included in the another one of the at least two resonators as viewed from above.

2. The acoustic wave filter according to claim 1, wherein the at least two resonators have an identical resonant frequency.

3. The acoustic wave filter according to claim 1, wherein a ratio of a total area of the island-shaped patterns or the aperture patterns to an area of the resonance region in the additional film included in the one of the at least two resonators is equal to a ratio of a total area of the island-shaped patterns or the aperture patterns to an area of the resonance region in the additional film included in the another one of the at least two resonators.

4. The acoustic wave filter according to claim 1, wherein the pitch interval of the island-shaped patterns or the aperture patterns is equal to or greater than a wavelength of an acoustic wave excited by the piezoelectric film.

5. The acoustic wave filter according to claim 1, wherein the one or more series resonators and the parallel resonators are connected in a ladder form.

6. The acoustic wave filter according to claim 1, wherein the at least two resonators are divided resonators formed by dividing one resonator and connected in series or parallel to each other.

7. A duplexer comprising:
a transmit filter; and
a receive filter,
wherein at least one of the transmit filter and the receive filter is the acoustic wave filter according to claim 1.

8. A module comprising:
the acoustic wave filter according to claim 1.

9. An acoustic wave filter comprising:
series resonators connected in series between an input terminal and an output terminal and formed of piezoelectric thin film resonators; and
one or more parallel resonators connected in parallel between the input terminal and the output terminal,
wherein each of at least two resonators of the series resonators includes an additional film having island-shaped patterns or aperture patterns formed at equal pitch intervals in a resonance region in which a lower electrode and an upper electrode face each other across a piezoelectric film, and
wherein a pitch interval of the island-shaped patterns or the aperture patterns in the additional film included in one of the at least two resonators differs from a pitch interval of the island-shaped patterns or the aperture patterns in the additional film included in another one of the at least two resonators, and a dimension of the island-shaped patterns or the aperture patterns in the additional film included in the one of the at least two resonators is equal to a dimension of the island-shaped patterns or the aperture patterns in the additional film included in the another one of the at least two resonators as viewed from above.

10. The acoustic wave filter according to claim 9, wherein the at least two resonators have an identical resonant frequency.

11. The acoustic wave filter according to claim 9, wherein a ratio of a total area of the island-shaped patterns or the aperture patterns to an area of the resonance region in the additional film included in the one of the at least two resonators is equal to a ratio of a total area of the island-shaped patterns or the aperture patterns to an area of the resonance region in the additional film included in the another one of the at least two resonators.

12. The acoustic wave filter according to claim 9, wherein the pitch interval of the island-shaped patterns or the aperture patterns is equal to or greater than a wavelength of an acoustic wave excited by the piezoelectric film.

13. The acoustic wave filter according to claim 9, wherein the series resonators and the one or more parallel resonators are connected in a ladder form.

14. The acoustic wave filter according to claim 9, wherein the at least two resonators are divided resonators formed by dividing one resonator and connected in series or parallel to each other.

15. A duplexer comprising:
a transmit filter; and
a receive filter,
wherein at least one of the transmit filter and the receive filter is the acoustic wave filter according to claim 9.

16. A module comprising:
the acoustic wave filter according to claim 9.

17. An acoustic wave filter comprising:
one or more series resonators connected in series between an input terminal and an output terminal; and
parallel resonators connected in parallel between the input terminal and the output terminal and formed of piezoelectric thin film resonators,
wherein each of at least two resonators of the parallel resonators includes an additional film having island-shaped patterns or aperture patterns formed at equal pitch intervals in a resonance region in which a lower electrode and an upper electrode face each other across a piezoelectric film,
wherein a pitch interval of the island-shaped patterns or the aperture patterns in the additional film included in one of the at least two resonators differs from a pitch interval of the island-shaped patterns or the aperture patterns in the additional film included in another one of the at least two resonators, and
wherein the at least two resonators have an identical resonant frequency.

* * * * *